United States Patent [19]

Erickson et al.

[11] Patent Number: 5,789,938
[45] Date of Patent: Aug. 4, 1998

[54] STRUCTURE AND METHOD FOR READING BLOCKS OF DATA FROM SELECTABLE POINTS IN A MEMORY DEVICE

[75] Inventors: Charles R. Erickson, Fremont; Robert O. Conn; Lois D. Cartier, both of Los Gatos, all of Calif.

[73] Assignee: Xilinx, Inc., San Jose, Calif.

[21] Appl. No.: 707,545

[22] Filed: Sep. 4, 1996

[51] Int. Cl.$^6$ .................................................. H03K 7/38
[52] U.S. Cl. .................................................. 326/40; 365/236
[58] Field of Search .................. 365/236; 326/38, 326/39, 40, 41

[56] References Cited

U.S. PATENT DOCUMENTS

| Re. 34,363 | 8/1993 | Freeman | 326/38 |
|---|---|---|---|
| 4,975,884 | 12/1990 | Waller | 365/236 |
| 5,452,261 | 9/1995 | Chung et al. | 365/236 |
| 5,457,408 | 10/1995 | Leung | 326/38 |
| 5,493,239 | 2/1996 | Zlotnick | 326/38 |
| 5,543,730 | 8/1996 | Cliff et al. | 326/38 |
| 5,608,342 | 3/1997 | Trimberger | 326/38 |
| 5,640,106 | 6/1997 | Erickson et al. | 326/38 |
| 5,650,734 | 7/1997 | Chu et al. | 326/38 |

FOREIGN PATENT DOCUMENTS

| 6-111562 | 4/1994 | Japan | 365/236 |
|---|---|---|---|

OTHER PUBLICATIONS

"EPC1 Configuration EPROM For FLEX Devices", pp. 1–8, Altera Corporation, Jul. 1995.

"Configuring FLEX 10K Devices", pp. 1–24, Altera Corporation, Dec. 1995.

"The Programmable Logic Data Book", pp. 2–32 through 2–35, Xilinx, 1994, San Jose, California.

*Primary Examiner*—Edward P. Westin
*Assistant Examiner*—Richard Roseen
*Attorney, Agent, or Firm*—Lois D. Cartier

[57] ABSTRACT

A self-addressing memory device is provided that can provide blocks of data starting from more than one initial location in the device, and may have the option of reading in either direction. This memory device can efficiently store multiple bitstreams, which may be of different sizes, that are used to configure one or more configurable logic devices. Each stored bitstream can be accessed in any order. In one embodiment, the configurable logic device is a Field Programmable Gate Array ("FPGA"). In one embodiment, the memory device is a Read-Only Memory ("ROM") that is either read up from all zeros or down from all ones. In one embodiment, the ROM includes a bidirectional chip enable chain that permits cascading multiple ROMs.

31 Claims, 4 Drawing Sheets

STRUCTURE AND METHOD FOR READING BLOCKS OF DATA FROM SELECTABLE POINTS IN A MEMORY DEVICE

BACKGROUND OF THE INVENTION

1. Field of the Invention

This invention relates to memory devices and to field programmable gate arrays programmed by loading a bitstream of data stored in one or more memory devices.

2. Description of the Background Art

"The Programmable Logic Data Book" ("Xilinx Data Book"), published by Xilinx, Inc. ("Xilinx") in 1994, describes field programmable gate arrays ("FPGAs") manufactured and sold by Xilinx. These FPGAs are further described in U.S. Pat. No. Re. 34,363, which is incorporated herein by reference. These FPGAs are capable of retrieving configuration data from a Programmable Read-Only Memory ("PROM") or other memory device. Several methods for retrieving configuration data from a single PROM are described in co-pending application Ser. No. 08/500,294 (docket no. M-3416-US), which is incorporated herein by reference.

DESCRIPTION OF BACKGROUND ART FIGURES

Figure 1:
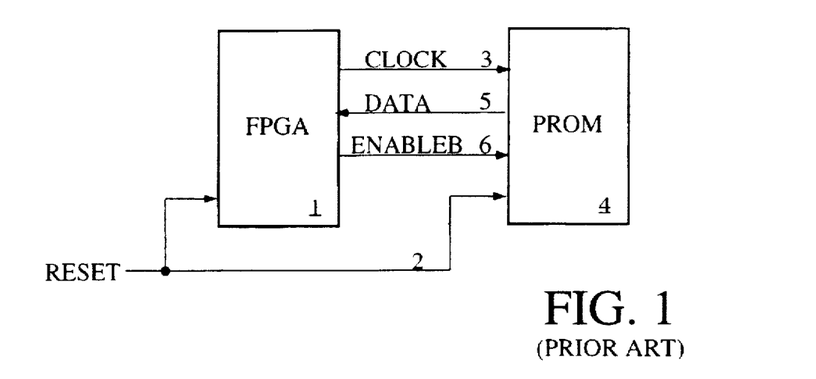
FIG. 1 schematically illustrates an FPGA in master serial configuration mode, configuring from a serial PROM.

One method for retrieving a configuration data stream ("bitstream") from a PROM is represented in FIG. 1. This method is referred to as "master serial configuration mode." Referring to FIG. 1, an FPGA 1 receives an initiating signal on reset line 2, which signal also initializes PROM 4. Alternatively, FPGA 1 may self-initialize in response to the application of a supply voltage. FPGA 1 generates a clock signal on a clock signal line 3. The clock signal is received by PROM 4, which generates in response thereto a bitstream DATA on an output line 5. The bitstream DATA is received by FPGA 1, which becomes configured in response thereto. When FPGA 1 is done configuring itself, it asserts an ENABLEB signal on line 6, indicating that configuration is complete. This signal deselects PROM 4.

Figure 2:
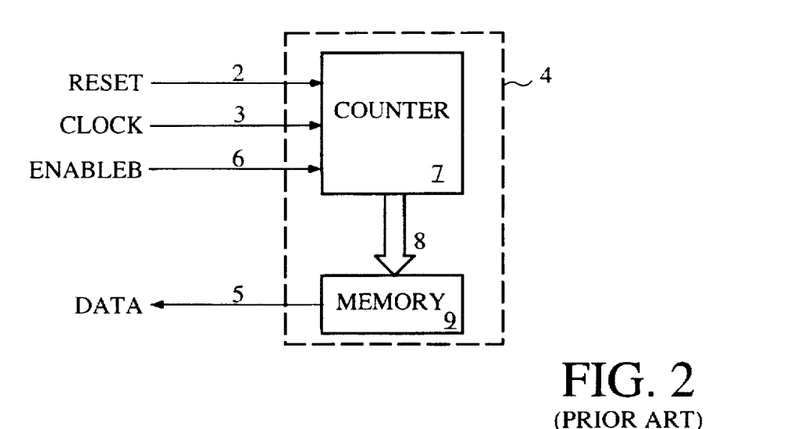
FIG. 2 schematically illustrates a serial PROM of the prior art.

Known PROMs generate the bitstream DATA on line 5 in FIG. 1 using a structure shown in FIG. 2. Referring to FIG. 2, an address counter 7 is initialized by a signal on reset line 2. Address counter 7 may be either an up counter or a down counter, but does not function as an up/down counter. The address in the counter is sent via address bus 8 to memory block 9. Memory block 9 places the contents of the memory address specified by address bus 8 onto bitstream line 5. Address counter 7 is updated periodically in response to an input clock signal on clock signal line 3, and sends a new address on address bus 8 to memory block 9. In response thereto, memory block 9 places the next bit of bitstream data onto bitstream line 5. When address counter 7 receives an ENABLEB signal on input signal line 6, address counter 7 ceases to count.

A similar method is known for retrieving a bitstream from a parallel PROM.

The term "self-addressing memory device" will be used herein to refer to any storage device that does not require externally supplied addresses to retrieve the data; the term therefore may include, but is not limited to, serial and parallel Programmable Read-Only Memories ("PROMs"), other Read-Only Memories ("ROMs"), and shift registers. These memory devices may be either volatile or nonvolatile. The term "self-addressing" as used herein does not imply the necessity for an addressing scheme; for example, shift registers do not require addressing. The term "ROMs" includes both programmable and non-programmable Read-Only Memories, which may provide either serial or parallel data.

No known self-addressing memory has the capability of setting the initial value in the counter to any of two or more values. No known self-addressing memory has the capability of optionally both incrementing and decrementing the internal counter.

Figure 3:
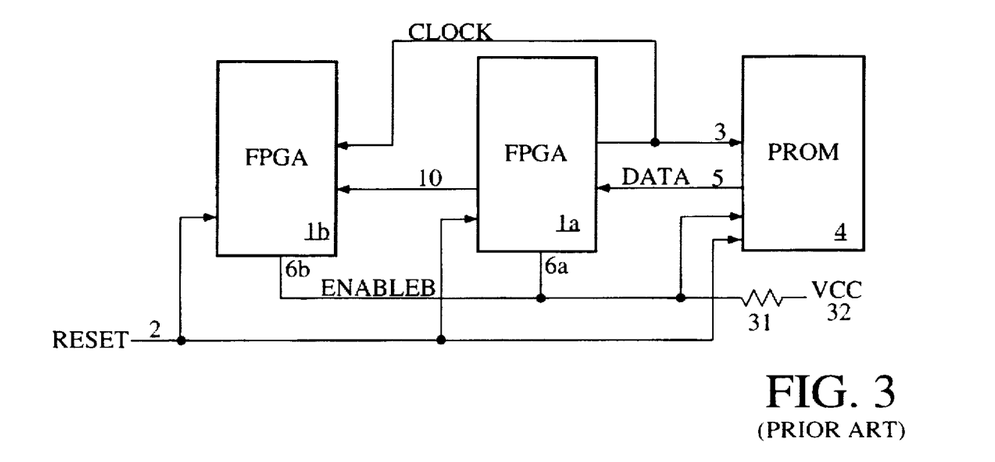
FIG. 3 schematically illustrates a 3-chip system comprising one FPGA in master serial configuration mode and one FPGA in slave serial configuration mode, configuring from a serial PROM.

In co-pending application Ser. No. 08/500,294, Leeds also describes a configuration method wherein the system includes first and second FPGAs, as shown in FIG. 3. The FIG. 3 system includes first and second FPGAs 1a and 1b and PROM 4. During configuration, FPGA 1a is in the "master serial configuration mode" and FPGA 1b is in the "slave serial configuration mode." (These configuration modes are described in the Xilinx Data Book on pages 2–32 to 2–35.) FPGA 1a, the master device, provides the signals that control the configuration of both master and slave devices. In response to an initiating signal on reset line 2, which also initializes FPGA 1b and PROM 4, or in response to the application of a supply voltage, FPGA 1a generates a clock signal on a clock signal line 3. This clock signal is input to both PROM 4 and FPGA 1b. PROM 4 responds to the clock signal by providing bitstream data signals to FPGA 1a on line 5. In this example, when FPGA 1a is done configuring itself, FPGA 1a continues to send clock signals to serial PROM 4 and FPGA 1b on signal line 3. Serial PROM 4 thus continues to send bitstream data to FPGA 1a via line 5. This data is passed from FPGA 1a to FPGA 1b via a signal line 10. FPGA 1b takes the bitstream data from line 10 and uses that data to configure itself. FPGAs 1a and 1b include open drain output buffers which drive leads 6a and 6b, respectively. Leads 6a and 6b are "wire-ANDed" together. That is, each of leads 6a and 6b is an open-drain output lead. They are tied to each other and also tied through a resistor 31 to a positive power supply 32. When FPGAs 1a and 1b are both done being configured, the signals on leads 6a and 6b go high, indicating that both FPGAs are done being configured. The high signals on leads 6a and 6b produce a high signal (ENABLEB) which deselects PROM 4.

It is known that the configuration method shown in FIG. 3 can be extended to permit configuration of more than two FPGAs with a single bitstream.

A similar method is known to retrieve a bitstream from a parallel PROM and configure multiple FPGAs. The parallel bitstream data is serialized by the master device, corresponding to FPGA 1a in FIG. 3. When FPGA 1a is done configuring itself, it sends the serialized bitstream to FPGA 1b via a signal line corresponding to signal line 10 in FIG. 3.

Figure 4:
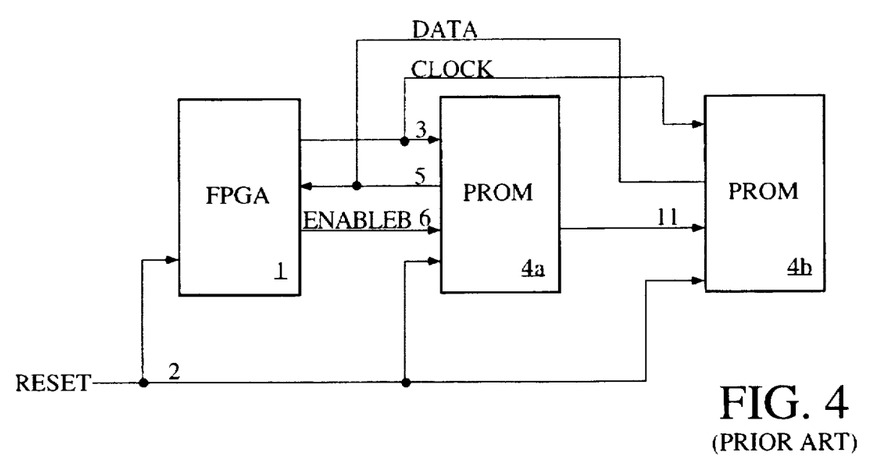
FIG. 4 schematically illustrates an FPGA in master serial configuration mode, configuring from first and second cascaded serial PROMs.

It is also known to use multiple PROMs to store a bitstream too large to fit in a single PROM of the size used in a given system. This technique is called "cascading." One example is shown on page 2–32 of the 1994 Xilinx Data Book. This example shows an FPGA in "master serial configuration mode" with first and second cascaded serial PROMs forming a "cascade chain." This method is shown in FIG. 4. Referring to FIG. 4, an FPGA 1 in master serial configuration mode receives an initiating signal on reset line 2, which also initializes PROMs 4a and 4b. Alternatively, FPGA 1 may self-initialize in response to the application of a supply voltage. FPGA 1 generates a clock signal on a clock signal line 3. The clock signal is received by serial PROMs 4a and 4b. PROM 4a generates in response thereto a bitstream on an output line 5. PROM 4b does not generate a bitstream at this time, because PROM 4a also generates a chip enable signal on output line 11, which disables PROM 4b until all of the contents of PROM 4a have been placed on bitstream signal line 5. When all of the contents of PROM 4a have been read, PROM 4a ceases to place data on bitstream signal line 5 and changes the state of chip enable signal 11. Thus PROM 4b begins to generate bitstream data on line 5. The serial data on line 5 is received by FPGA 1, which becomes configured in response thereto. When FPGA 1 is done configuring itself, it asserts an ENABLEB signal on line 6, indicating that configuration is complete. This signal deselects PROM 4a. In response thereto, PROM 4b changes the state of chip enable signal 11, which deselects PROM 4b.

A similar method is known to retrieve a bitstream from multiple parallel PROMs.

DISADVANTAGES OF THE BACKGROUND ART

One advantage of using FPG in a system is the capability of reconfiguring the FPGA or FPGAs to perform a different function without making physical changes to the system. It can be desirable to store multiple bitstreams in a PROM (or in a series of FIROMs as in FIG. 4) to permit such reconfiguration. The known method for storing multiple bitstreams is to store the bitstream data sequentially in the PROM, such that after the FPGA or FPGAs are completely configured, the internal counter in the PROM addresses the first location in the next bitstream. The data at this address is then available if another configuration is initiated.

A disadvantage of this method is that the bitstreams can only be accessed in the same sequential order as they are stored in the PROM. Initializing the PROM counter permits access to the first bitstream at any time, but any further bitstreams can only be accessed sequentially.

Another method for storing multiple bitstreams in a single PROM is to segment the PROM into two or more banks of memory locations ("memory banks"), and to select one of the memory banks based on one or more "bank select" input signal lines to the PROM. This method overcomes the disadvantage of sequential access, but the size of a bitstream is limited to the size of one memory bank of the PROM. As an additional disadvantage, this method is unsuited to the storage of bitstreams of widely varying sizes. Such bitstreams are required in multiple-FPGA systems where it is sometimes desired to configure several FPGAs, and sometimes to configure only one or a few FPGAs. The size of each memory bank must be such that the largest bitstream can be stored in a single memory bank. This structure and method result in wasted memory storage in the memory banks containing the smaller bitstreams.

It is desirable to create a self-addressing memory device which can efficiently store multiple bitstreams of varying sizes, while allowing access to any bitstream at any time.

SUMMARY OF THE INVENTION

A self-addressing memory device in accordance with this invention is capable of reading blocks of data starting from any of two or more initial locations, and may have the option of reading the data in either of two directions from the initial location.

The stored bitstreams can be accessed in any sequence, because the choice of initial values permits more than one starting point for reading the stored data. Each bitstream can be stored with the first data starting at a different initial value.

Bitstreams of different sizes can be efficiently accommodated, because not every initial value need be used. A single bitstream can continue beyond the initial point where a second bitstream could be stored. The initial points do not form barriers to the data. The only limitation on the size of the largest bitstream is that it must be no larger than the data space of the self-addressing memory device, or the total data space of all self-addressing memory devices in the system, if cascaded memory devices are used.

Even more efficient bitstream storage results from the capability to read data in either of two directions from the initial location. This capability permits the storage of two bitstreams of widely varying sizes between any two initial locations, with data read from each location towards the other location. As long as the combined size of the two bitstreams is smaller than the data space, the bitstreams can be stored and used. The relative size of the two bitstreams is immaterial.

In one embodiment, the device is a serial PROM that includes an address counter cap)able of assuming any of two or more initial values, based on the status of one or more external input signals to the PROM. The address counter may be further capable of either incrementing or decrementing, based in one embodiment on the status of an external input signal to the PROM. In one embodiment, a single external input signal selects between "increment from minimum" and "decrement from maximum" for the address counter. A maximum of two bitstreams can be stored in this PROM. The combined size (of the two bitstreams must be no larger than the total data space of the PROM. The bitstreams can be accessed in any sequence.

In a second embodiment, two input signals to a PROM select any of four initial values for the address counter, and determine whether the address counter is to be incremented or decremented. The four selections are: 1) increment from minimum; 2) decrement from a first address value between the minimum and the maximum; 3) increment from a second address value between the minimum and the maximum, typically one memory location higher than the first address value; and 4) decrement from maximum.

This embodiment permits the storage of from one to four bitstreams in a single PROM. A single bitstream may be any size up to the size of the entire PROM data space. First and second bitstreams must have a total size no larger than the entire PROM data space. However, smaller portions of the PROM may be used for smaller bitstreams. For example, the PROM can be partitioned into two data spaces, from initial value (1) to (2), and from initial value (3) to (4). In this example, the first and second bitstreams can have a total size no larger than the data space from the minimum address (1) to the first address (2). The third and fourth bitstreams can have a total size no larger than the data space from the second address (3) to the maximum address (4). This embodiment provides flexibility in combining bitstreams of different sizes. The bitstreams can be accessed in any sequence.

In a third embodiment, PROMs with an input signal selecting between "increment from minimum" and "decrement from maximum" for the address counter are modified to permit cascading of two or more PROMs. Bidirectional chip enable pins are provided. The direction of these pins (input or output) is determined by the same PROM input signal that selects between increment and decrement. This embodiment allows efficient storage of two bitstreams with a total size too large to fit into a single PROM, while allowing access to the bitstreams in any sequence.

DETAILED DESCRIPTION OF EMBODIMENTS

The embodiments are described in terms of serial PROMs; obvious variants of the described embodiments include those directed to parallel PROMs, other ROMs, and shift registers.

FIRST EMBODIMENT

Figure 5:
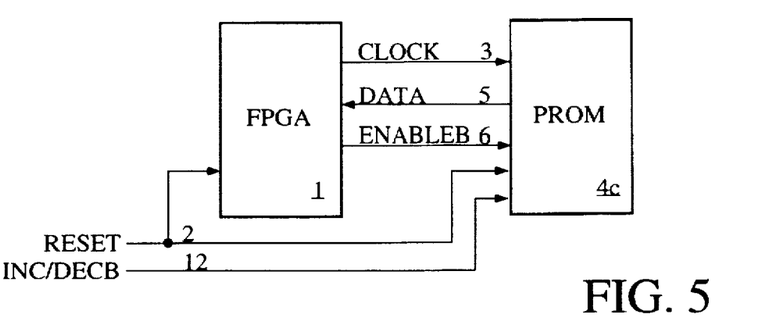
FIG. 5 schematically illustrates an FPGA in master serial configuration mode, configuring from a serial PROM that allows increment from minimum or decrement from maximum in accordance with a first embodiment of the invention.

In FIG. 5, a system containing a first embodiment of the present invention is shown. This system incorporates an input signal to the PROM that selects between "increment from minimum" (with the minimum address being all zeros in one embodiment) and "decrement from maximum" (with the maximum address being all ones in one embodiment).

Referring to FIG. 5, an FPGA 1 receives an initiating reset signal on input signal line 2. The signal on reset line 2 also initializes PROM 4c to a value dependent on the state of an INC/DECB signal on input signal line 12. Alternatively, FPGA 1 may self-initialize in response to the application of a supply voltage. FPGA 1 generates a clock signal on a clock signal line 3. The clock signal is received by serial PROM 4c, which generates in response thereto a data bitstream on an output line 5. The bitstream is read from the memory block in PROM 4c by either increasing or decreasing an internal address, depending on the state of the INC/DECB signal on signal line 12. The serial data on line 5 is received by FPGA 1, which becomes configured in response thereto. Then FPGA 1 is done configuring itself, it asserts an ENABLEB signal on line 6, indicating that configuration is complete. This signal deselects PROM 4c.

Although FIG. 5 shows a system with one FPGA, it would be obvious to one of ordinary skill in the art to increase the number of FPGAs by means of the known configuration method shown in FIG. 3.

Figure 5A:
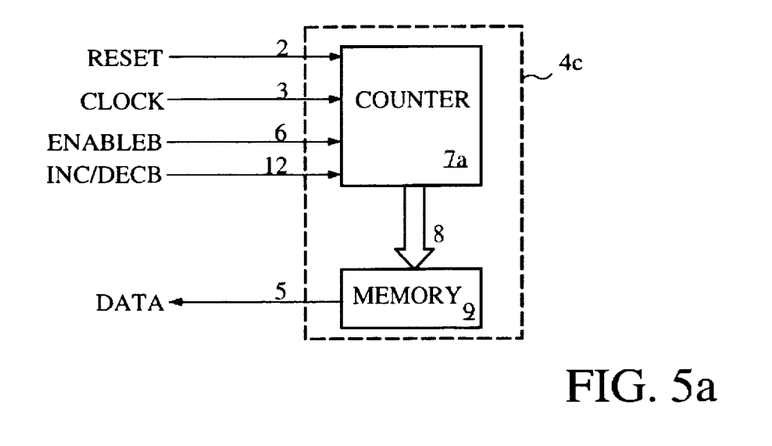
FIG. 5a schematically illustrates a serial PROM with the ability to increment from minimum or decrement from maximum in accordance with a first embodiment of the invention.

In FIG. 5a, PROM 4c incorporated in FIG. 5 is shown. Referring now to FIG. 5a, an address counter 7a in PROM 4c is initialized by the reset signal on input signal line 2 to either a minimum or a maximum value, depending on the state of the INC/DECB input signal on line 12. Address counter 7a functions as either an up counter or a down counter, depending on the state of the INC/DECB input signal on line 12. In one embodiment, a high value on INC/DECB line 12 sets the counter initialization value to all zeros and configures address counter 7a as an up counter, while a low value on INIC/DECB line 12 sets the counter initialization value to all ones and configures address counter 7a as a down counter. The address in address counter 7a is sent via address bus 8 to memory block 9. Memory block 9 places the contents of the memory address specified by address bus 8 onto data bitstream line 5. Address counter 7a is updated periodically in response to an input clock signal on clock signal line 3, and sends a new address on address bus 8 to memory block 9. In response thereto, memory block 9 places the next bit of bitstream data on output line 5. When address counter 7a receives an ENABLEB signal on input signal line 6, address counter 7a ceases to count.

SECOND EMBODIMENT

Figure 6:
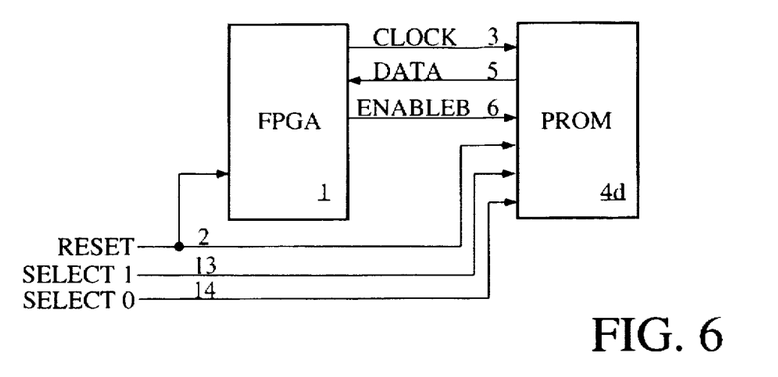
FIG. 6 schematically illustrates an FPGA in master serial configuration mode, configuring from a serial PROM that allows immediate access to any of up to four bitstreams in accordance with a second embodiment of the invention.

In FIG. 6, a system containing a second embodiment of the present invention is shown. This system incorporates two input signals to the PROM that select any of four initial values for the address counter, and determine whether the address counter is to be incremented or decremented. The four selections are: 1) increment from minimum (with the minimum address being all zeros in one embodiment); 2) decrement from d first address value between the minimum and the maximum (the midpoint of the addressable memory in one embodiment); 3) increment from a second address value between the minimum and the maximum (one memory location higher than the first address value in one embodiment); and 4) decrement from maximum (with the maximum address being all ones in one embodiment).

Referring to FIG. 6, FPGA 1 receives an initiating reset signal on input signal line 2. The reset signal on line 2 also initializes PROM 4d to any of four initial values based on the state of the two signals on select input signal lines 13 and 14. Alternatively, FPGA 1 may self-initialize in response to the application of a supply voltage. FPGA 1 generates a clock signal on a clock signal line 3. The clock signal is received by serial PROM 4d, which generates in response thereto a data bitstream on an output line 5. The bitstream is read from PROM 4d by either increasing or decreasing an internal address, depending on the states of the two signals on signal select lines 13 and 14. The serial data on line 5 is received by FPGA 1, which becomes configured in response thereto. When FPGA 1 is done configuring itself, it asserts an ENABLEB signal on line 6, indicating that configuration is complete. This signal deselects PROM 4d.

Figure 6A:
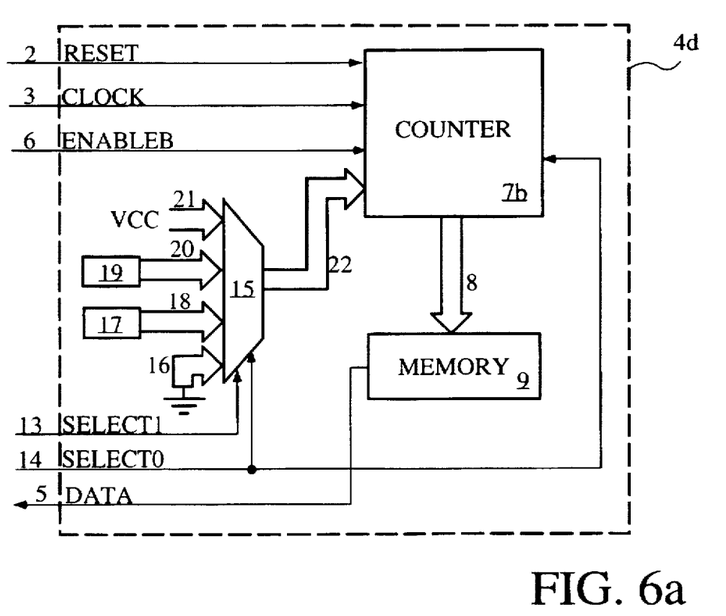
FIG. 6a schematically illustrates a serial PROM that allows immediate access to any of up to four bitstreams in accordance with a second embodiment of the invention.

In FIG. 6a, PROM 4d incorporated in FIG. 6 is shown. Referring now to FIG. 6a, an address counter 7b in PROM 4d is initialized by the reset signal on line 2 to any of four initial values, based on the states of the two select signals on input signal lines 13 and 14. In one embodiment, the initialization value is created by a 4-to-1 multiplexer 15. The select lines of multiplexer 15 are the select input signals on signal lines 13 and 14. The four inputs to multiplexer 15 in this embodiment are: 1) a ground signal bus 16; 2) a value stored in a memory 17 and sent to multiplexer 15 on a bus 18; 3) a value stored in a memory 19 and sent to multiplexer 15 on a bus 20; and 4) a bus 21 driven by the positive power supply. The multiplexer 15 output is sent to address counter 7b via bus 22. Address counter 7b functions as either an up counter or a down counter, depending on the state of the signal on line 14. As shown in the following table, in this embodiment, a high value on line 14 selects a down counter, and a low value on line 14 selects an up counter.

| 13 | 14 | Initial Value | Up/Down |
|---|---|---|---|
| 1 | 1 | all ones (21) | Down |
| 1 | 0 | intermediate point + 1 (20) | Up |
| 0 | 1 | intermediate point (18) | Down |
| 0 | 0 | all zeros (16) | Up |

The address in address counter 7b is sent via address bus 8 to memory block 9. Memory block 9 places the contents of the memory address specified by address bus 8 onto bitstream line 5. Address counter 7b is updated periodically in response to an input clock signal on clock signal line 3, and sends a new address on address bus 8 to memory block 9. In response thereto, memory block 9 places the next bit of bitstream data on output line 5. When address counter 7b receives an ENTABLEB signal on input signal line 6, address counter 7b ceases to count.

One embodiment of the present invention implements multiplexer 15 shown in FIG. 6a as a separate multiplexer for each bit of the address counter. Each multiplexer could be implemented as a set/reset flip-flop for the counter bit.

In one embodiment of the invention, memories 17 and 19 are implemented as writable registers, allowing the two initialization values on buses 18 and 20 to be set by the user.

Although FIG. 6a shows an address counter with four possible initial values, it is possible to supply only three initial values, with the fourth option performing an automatic increment or decrement of the intermediate initial value, to create the fourth starting address for the bitstreams.

Based on the description above, it would be obvious to one of ordinary skill in the art to provide more than four initial values for the address counter.

THIRD EMBODIMENT

Figure 7:
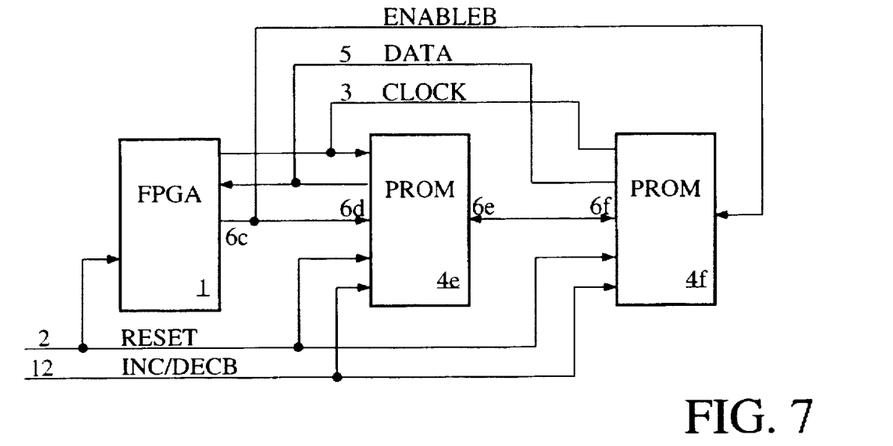
FIG. 7 schematically illustrates an FPGA in master serial configuration mode, configuring from a first PROM and a second PROM, each of which allows increment from minimum or decrement from maximum, and further allows a reversible enable chain to permit cascading of this function in accordance with a third embodiment of the invention.

In FIG. 7, a system containing a third embodiment of the present invention is shown. This system incorporates an input signal to the PROM that selects between "increment from minimum" (with the minimum address being all zeros in one embodiment) and "decrement from maximum" (with the maximum address being all ones for one embodiment) for the address counter, and also includes bidirectional chip enable pins to permit cascading of two or more PROMs.

Referring to FIG. 7, FPCA 1 in master serial configuration mode receives an initiating signal on reset line 2, which also initializes PROMs 4e and 4f to a value dependent on the state of an IN(/DECB signal on signal line 12. Alternatively, FEPGA 1 may self-initialize in response to the application of a supply voltage. FPGA 1 generates a clock signal on a clock signal line 3. The clock signal is received by serial PROMs 4e and 4f.

In the embodiment of FIG. 7, if the INC/DECB signal on signal line 12 is high, PROM 4e generates in response to the clock signal on line 3 a data bitstream on an output line 5. PROM 4f does not generate a bitstream at this time, because PROM 4e also generates a chip enable signal on input/output line 6e, which disables PROM 4f until all of the contents of PROM 4e have been placed on bitstream signal line 5. When all of the contents of PROM 4e have been read, PROM 4e ceases to place data on bitstream signal line 5, and changes the state of bi-directional chip enable signal 6e. Thus PROM 4f begins to generate bitstream data on line 5. The serial data on line 5 is received by FPGA 1, which becomes configured in response thereto. When FPGA 1 is done configuring itself, it asserts an ENABLEB signal on line 6c, indicating that configuration is complete. This signal deselects PROM 4e. In response thereto, PROM 4e changes the state of chip enable signal 6e, which deselects PROM 4f.

In FIG. 7, if the INC/DECB signal on signal line 12 is low, PROM 4f generates in response to the clock signal on line 3 a bitstream on output line 5. PROM 4e does not generate a bitstream at this time, because PROM 4f also generates a chip enable signal on input/output line 6f, which disables PROM 4e until all of the contents of PROM 4f have been placed on bitstream signal line 5. When all of the contents of PROM 4f have been read, PROM 4f ceases to place data on data bitstream signal line 5, the chip enable signal on line 6f changes state, and PROM 4e begins to generate bitstream data on line 5. The serial data on line 5 is received by FPGA 1, which becomes configured in response thereto. When FPGA 1 is done configuring itself, it asserts an ENABLEB signal on line 6c, indicating that configuration is complete. This signal deselects PROM 4f. In response thereto, chip enable signal 6f changes state and deselects PROM 4e.

Figure 7A:
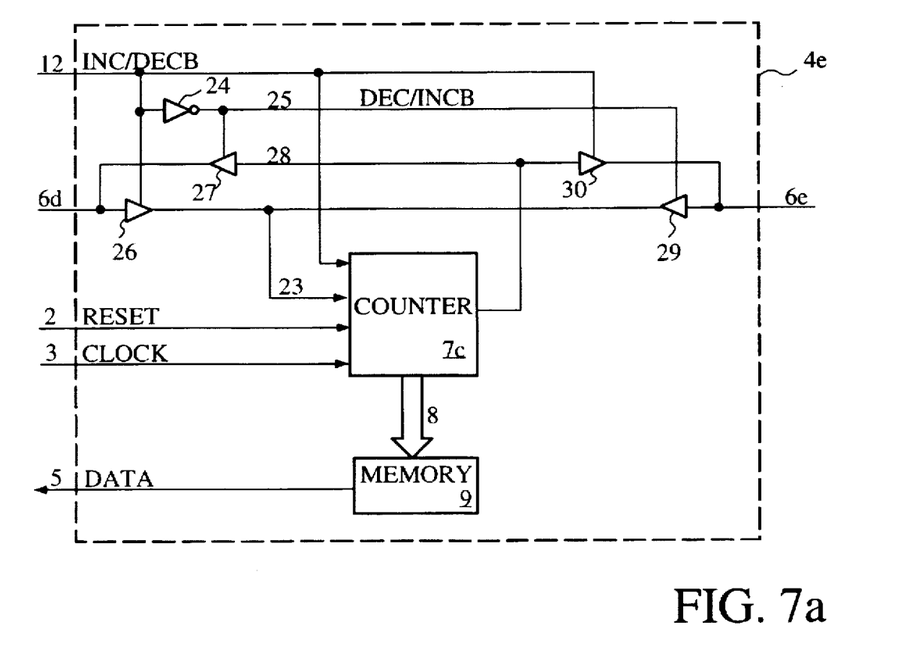
FIG. 7a schematically illustrates a serial PROM that allows increment from minimum or decrement from maximum, and further allows a reversible enable chain to permit cascading of this function in accordance with a third embodiment of the invention.

In FIG. 7a, PROM 4e incorporated in FIG. 7 is shown. Referring now to FIG. 7a, an address counter 7c in PROM 4e is initialized by the reset signal on line 2 to either a minimum or a maximum value, depending on the state of the INC/DECB input signal on line 12. Address counter 7c functions as either an up counter or a down counter, depending on the state of the IN(/DECB input signal on line 12. In one embodiment, a high value on INC/DECB sets the counter initialization value to all zeros and configures address counter 7c as an up counter, while a low value on INC/DECB sets the counter initialization value to all ones and configures address counter 7c as a down counter. The address in address counter 7c is sent via address bus 8 to memory block 9. Memory block 9 places the contents of the memory address specified by address bus 8 onto bitstream line 5. Address counter 7c is updated periodically in response to an input clock signal on clock signal line 3, and sends a new address on address bus 8 to memory block 9. In response thereto, memory block 9 places the next bit of bitstream data onto output line 5. When address counter 7c receives a disable signal on signal line 23, address counter 7c ceases to count.

In one embodiment, signal line 23 of FIG. 7a is generated from signal lines 6d and 6e and the INC/DECB input signal on line 12. The IMC/DECB signal is inverted by inverter 24 to form the DEC/INCB signal 25. Signal line 6d is bidirectional: signal line 6d provides the input to a 3-state buffer 26 enabled by the INC/DECB signal on line 12, and forms the output of a 3-state buffer 27 enabled by the DEC/INCB signal 25. The output of 3-state buffer 26 is the enable signal on line 23. The input of 3-state buffer 27 is a signal on line 28 that in one embodiment is a terminal count generated by address counter 7c when enabled through signal line 23 and the counting cycle is complete. Signal line 6e is also bidirectional: signal line Ce provides the input to a 3-state buffer 29 enabled by the DEC/INCB signal 25, and forms the output of a 3-state buffer 30 enabled by the INC/DECB signal 12. The output of 3-state buffer 29 is the enable signal on line 23. The input of 3-state buffer 30 is signal 28.

Referring to FIG. 7a, it can be seen that signal lines 6d and 6e form a bidirectional path through PROM 4e, passing through address counter 7c. The directionality of the path is controlled by the INC/DECB signal 12. The one of signal lines 6d and 6e functioning as an input provides an enable/disable signal for address counter 7c. The other signal line functions as an output and provides an enable/disable signal that can be used to control another serial PROM. Signal lines 6d and 6e can, therefore, be tied together in a cascaded chain of chip enable signals that will run (in FIG. 7) from left to right when INC/DECB 12 is high (for incrementing address counter 7c) and from right to left when INC/DECB 12 is low (for decrementing address counter 7c). This embodiment, therefore, allows reading a chain of two or more PROMs from either end.

OTHER EMBODIMENTS

Modifications to the described embodiments, as well as additional embodiments of the invention, will be apparent to those of ordinary skill in the art in light of the foregoing description. Obvious variants of the described embodiments include those directed to parallel PROMs, other ROMs, and shift registers.

We claim:

1. A memory circuit comprising:
   a counter initializable to a plurality of internally generated values;
   means for selecting one of said values for initializing said counter;
   a memory addressed by said counter;
   a clock input signal line;
   an output signal line; and
   data means for providing data from said memory on said output signal line in synchronization with a signal on said clock input signal line.

2. A memory circuit as in claim 1 wherein said counter is capable of both incrementing and decrementing, and further comprising:
   means for controlling the direction of said counter.

3. A memory circuit as in claim 2 further comprising:
   means for implementing a bidirectional cascaded chain of ROMs.

4. A memory circuit as in claim 3 wherein said means for implementing comprises first and second bidirectional signal lines, of which during operation said first signal line is an input line and said second signal line is an output line.

5. A memory circuit as in claim 2 wherein said counter is initializable to a minimum value and a maximum value.

6. A memory circuit as in claim 5 wherein said means for selecting and said means for controlling the direction of said counter comprises a shared select input signal line.

7. A memory circuit as in claim 2 wherein said memory circuit is part of a logic system comprising a programmable logic device, said memory circuit providing configuration data to said programmable logic device.

8. A memory circuit as in claim 7 wherein said programmable logic device is an FPGA.

9. A memory circuit as in claim 1 wherein said memory circuit is part of a logic system comprising a programmable logic device, said memory circuit providing configuration data to said programmable logic device.

10. A memory circuit as in claim 9 wherein said programmable logic device is an FPGA.

11. A memory circuit as in claim 1 wherein a first initialization value is a minimum addressable value and a second initializable value is a maximum addressable value, and further comprising:
    means for incrementing from said first initialization value; and
    means for decrementing from said second initialization value.

12. A system comprising:
    a memory circuit for providing data on a data bus, said memory circuit including a memory and a counter for addressing said memory, said counter being initializable to a plurality of internally generated values; and
    a programmable logic device for receiving said data and using said data to configure itself.

13. A system as in claim 12 wherein said programmable logic device is an FPGA.

14. A system as in claim 12 wherein said counter is capable of both incrementing and decrementing.

15. A system as in claim 14 wherein said programmable logic device is an FPGA.

16. A system as in claim 14 further comprising:
    means for implementing a bidirectional cascaded chain of memory circuits.

17. A system as in claim 16 wherein said means for implementing comprises first and second bidirectional signal lines, of which during operation said first signal line is an input line and said second signal line is an output line.

18. A self-addressing memory circuit comprising:
    a data space with a plurality of internally generated initial locations;
    means for selecting one of said initial locations;
    a clock input signal line;
    an output signal line; and
    data means for providing data from said data space on said output signal line in synchronization with a signal on said clock input signal line.

19. A self-addressing memory circuit as in claim 18 further comprising:
    reading means for reading data in either of two directions from an initial location selected by the means for selecting; and
    controlling means for controlling the direction of said reading means.

20. A self-addressing memory circuit as in claim 19 further comprising:
    means for implementing a bidirectional cascaded chain of self-addressing memory circuits.

21. A self-addressing memory circuit as in claim 20 wherein said means for implementing comprises first and second bidirectional signal lines, of which during operation said first signal line is an input line and said second signal line is an output line.

22. A self-addressing memory circuit as in claim 19 wherein said self-addressing memory circuit is part of a logic system comprising a programmable logic device, said self-addressing memory circuit providing configuration data to said programmable logic device.

23. A self-addressing memory circuit as in claim 22 wherein said programmable logic device is an FPGA.

24. A self-addressing memory circuit as in claim 18 wherein said self-addressing memory circuit is part of a logic system comprising a programmable logic device, said self-addressing memory circuit providing configuration data to said programmable logic device.

25. A self-addressing memory circuit as in claim 24 wherein said programmable logic device is an FPGA.

26. A system comprising:
   a self-addressing memory for providing data on a data bus, said self-addressing memory including a data space with a plurality of internally generated initial locations; and
   a programmable logic device for receiving said data and using said data to configure itself.

27. A system as in claim 26 wherein said programmable logic device is an FPGA.

28. A system as in claim 26 wherein said self-addressing memory includes reading means for reading data in either of two directions from the initial location.

29. A system as in claim 28 wherein said programmable logic device is an FPGA.

30. A system as in claim 28 further comprising:
   means for implementing a bidirectional cascaded chain of self-addressing memory circuits.

31. A system as in claim 30 wherein said means for implementing comprises first and second bidirectional signal lines, of which during operation said first signal line is an input line and said second signal line is an output line.

* * * * *